United States Patent [19]

Yen

[11] Patent Number: 5,340,774
[45] Date of Patent: Aug. 23, 1994

[54] SEMICONDUCTOR FABRICATION TECHNIQUE USING LOCAL PLANARIZATION WITH SELF-ALIGNED TRANSISTORS

[75] Inventor: Ting-Pwu Yen, Fremont, Calif.

[73] Assignee: Paradigm Technology, Inc., San Jose, Calif.

[21] Appl. No.: 13,466

[22] Filed: Feb. 4, 1993

[51] Int. Cl.$^5$ .................................... H01L 21/283
[52] U.S. Cl. ............................ 437/240; 437/978; 148/DIG. 133
[58] Field of Search ............ 437/44, 186, 187, 192, 437/200, 201, 240, 978, 982; 148/DIG. 43, DIG. 133

[56] References Cited

U.S. PATENT DOCUMENTS 5,166,771  11/1992  Godinho et al. ................ 257/754
5,200,358   4/1993  Bollinger et al. ............... 437/978

FOREIGN PATENT DOCUMENTS 3071637  3/1991  Japan ........................ 437/982
4317358 11/1992  Japan ........................ 437/240

Primary Examiner—Tom Thomas
Assistant Examiner—Chandra Chaudhari
Attorney, Agent, or Firm—Skjerven, Morrill, MacPherson, Franklin & Friel

[57] ABSTRACT

A CMOS integrated circuit fabrication technique for forming self-aligned transistors combined with local planarization in the vicinity of the transistors so as to allow local interconnects which are free of bridging, have good continuity over the planarized topography and are compatible with the self-alignment schemes, hence conserving chip real estate. The technique is compatible with planarization schemes using BPSG, BPTEOS, SOG or CMP. After formation of self-aligned insulated transistor gates and active transistor regions, the integrated circuit structure is planarized by formation of an oxide layer and a reflowed overlying glass layer. The glass layer is etched back to planarize the surface. Using a buried contact mask the remaining portions of the glass layer and underlying oxide layer are removed in the area of the buried contact only. In one version (prior to formation of the oxide layer and glass layer) a polysilicon "landing pad" is formed on the substrate at the buried contact location so as to allow more effective etching at the exact location of the buried contact.

22 Claims, 5 Drawing Sheets

SEMICONDUCTOR FABRICATION TECHNIQUE USING LOCAL PLANARIZATION WITH SELF-ALIGNED TRANSISTORS

BACKGROUND OF THE INVENTION

1. Field of the Invention

This invention relates to a self-aligned contact and interconnect structure, and method for making same, for use in integrated circuits and particularly in CMOS integrated circuits, having broad applicability in both memory and logic products- More specifically, the invention relates to integrated circuit multi-layer local interconnections where the transistors are self-aligned and a relatively thick planarization layer is formed locally over the transistors.

2. Description of the Prior Art

U.S. Pat. No. 5,166,771 (incorporated herein by reference) issued Nov. 24, 1992 and entitled "Self-Aligning Contact and Interconnect Structure", Norman Godinho et al. describes a self-aligned contact structure which allows for high packing density (i.e., more transistors per unit area) of integrated circuits without forcing the production process to finer line geometries and hence higher cost.

The self-aligning source and drain contacts described therein overlap the gate electrode, and yet do not cause a short circuit between the source and drain on the one hand and the gate on the other hand. This overlapping also allows for a looser alignment tolerance requirement, and the photolithographic operations by which the CMOS transistor is made provide a smaller size transistor.

Contacts to the polycrystalline silicon ("polysilicon") gate are made on top of the gate region over the active channel, because the source and drain regions are protected by a hardened layer of photoresist during etching of the insulation to expose the gate contact. This allows a reduction in the size of the field of the device which saves valuable silicon area and allows a higher packing density to be obtained in a given integrated circuit.

In one embodiment a layer of titanium silicide covered by a thin film of titanium nitride is formed on the exposed source, drain and polysilicon gate contacts. The silicided areas are formed only in selected locations.

The second layer of polysilicon is deposited and patterned to form local interconnects. The etching process to define the local interconnects does not attack the exposed underlying silicided source, drain and gate contacts in the interconnects. Therefore, the polysilicon local interconnect layer is not required to completely cover and protect the source, drain and gate contacts in the interconnects, reducing alignment tolerance and saving space.

However, this patent (and other well known prior art using self-alignment without surface planarization and high topography) faces the typical problem that as an integrated circuit layout area is reduced it becomes more difficult to ensure a stringer-free (without local bridging) interconnect. This is because of the relatively tight gaps created. Current planarization techniques require the layout area to be enlarged, to allow the local interconnects to make contact to the underlying conductors. This is because as the valleys (for instance between the gate structures) are filled with a planarizing dielectric, it becomes difficult to make electrical contact to the bottoms of the valleys while simultaneously extending the electrical contacts to the tops of the gate structures, without sacrificing semiconductor fabrication process margin.

That is to say, most prior art self-aligning techniques are useful when the local interconnections are made through thin isolation layers to make contact with the active regions of the transistor in the semiconductor substrate. It is possible thereby to form a self-aligned transistor using relatively small layout areas. However, problematically in such a case the surface is not planar due to the relatively thin dielectric, and this results in a relatively high topology, i.e. the gate structures are relatively high steps above the semiconductor substrate surface. In this case when relatively narrow interconnect lines are formed there is frequently a problem with bridging, in that stringers are left on the steps overlying the gate structures. The extreme overetches needed to remove such stringers often undesirably break the continuity of the local interconnect lines.

Therefore, with the prior art self alignment techniques it is almost impossible to use a thick planarizing dielectric, because such a thick dielectric reduces the process margins, causing one conductor to undesirably contact another conductor in spite of the self-alignment. (In this case, typically a thin planarization dielectric is approximately 1000 to 1500 Å thickness or less, and a thick dielectric is anything greater in thickness.)

Thus in the prior art, local planarization for transistor fabrication is contradictory to self alignment schemes. It would be desirable to combine the two so as to achieve both the relative economy of self-alignment techniques which reduce the number of masking steps, with the advantages of a planarized surface which allows formation of relatively tight pitched narrow interconnect lines. Planarization is important because it overcomes the continuity problems caused by severe (non-planar) topography. First, severe topography causes problems during implantation of doped regions due to inadequate implantation concentrations on the vertical step portions, causing resistance varying across the step. Second, severe topography causes a similar problem where silicidization (such as of titanium) or any sputtered metal layer crosses a step, in terms of poor coverage and hence thinning of the metal layer over the step. This combination of self alignment and local planarization is especially important in semiconductor fabrication techniques using multi-layer local interconnections below the first major and middle interconnect layer, such as used in a planarized BPSG (borophosphosilicate glass) or SOG (spun on glass) or CMP (chemically mechanically polished) planarized surface.

SUMMARY OF THE INVENTION

In accordance with the invention, a transistor fabrication scheme allows formation of self-aligned transistors while providing planarization of the surface of the integrated circuit over the self aligned transistors. This is achieved by a process which first forms on the principal surface of a semiconductor substrate the gate structures and uses those gate structures conventionally to define the locations of the self-aligned active source and drain regions of the transistor in the semiconductor substrate, typically by ion implantation and diffusion.

Then the principal surface of the substrate is planarized by forming a planarizing filler layer over the substrate surface and over the gate structures. A buried contact opening is then defined through the filler layer to at least one of the implanted regions by using a buried contact mask to remove a portion of the filler layer overlying the doped region. The remainder of the filler layer remains as defined by the contact mask. A local interconnect conductive layer is then formed in the contact opening and extending over the adjacent gate structure. This advantageously provides self-alignment in combination with planarization by removing the planarizing material only in the area of the buried contact to the semiconductor substrate.

In one embodiment, this process involves, after forming the insulated transistor gates and self-aligned active transistor regions, forming an oxide layer over the principal substrate surface and over the gate structures and then covering the oxide layer with a glass layer, for instance reflowed BPSG. The BPSG is then etched down to expose the oxide layer over the gate structures, leaving the BPSG in the valleys between the gate structures. A polycrystalline silicon layer mask is then formed and patterned over the etched-back BPSG and the mask layer is patterned so that it is removed only in the area of the desired buried contact. The BPSG is then etched away in the buried contact region, as is the underlying oxide layer, forming an opening to the semiconductor substrate which then may be contacted by a metal or other conductive material interconnect layer.

In another embodiment, after formation of the gate structures and associated self aligned active transistor regions, a thin mask layer of a material such as polysilicon is deposited over the principal surface of the substrate and over the gate structures. The mask layer is then patterned using a first buried contact mask, so as to remain only in the area of the contact opening on the semiconductor substrate and slightly overlapping the adjacent gate structure. Then a layer of oxide is deposited over the entire surface, followed by deposition of a BPSG layer which is then reflowed and etched back (as above) leaving the BPSG layer present only in the valleys between gate structures.

Then the BPSG and underlying oxide layer are selectively removed in the area of the desired contact by use of a second buried contact mask. Then the underlying polysilicon layer is removed followed by removal of the thin source/drain oxide layer leaving the opening to the semiconductor substrate while the remainder of the integrated circuit structure is still planarized by the oxide layer and overlying remaining portions of the BPSG layer.

Both of the above embodiments are combined with a polysilicon isolation mask technique which allows contacts also to be formed to the gate structure by etching away the gate insulating layers on the upper surface of the gate structures, to allow electrical contact to be made thereto selectively.

Advantageously the above process is not limited to a BPSG planarizing layer but also, for instance, is useful with SOG or CMP planarized surface techniques and is especially suited to the self alignment scheme described in the above-referenced patent.

The method in accordance with the present invention planarizes the topography of the integrated circuit to allow the local interconnects to be free of bridging, to have better continuity (lower resistance) over a relatively less severe (i.e. somewhat planarized) topography, and yet still be compatible with self alignment schemes that are relatively compact. Thus the goal of combining self alignment with local planarization is achieved.

The above-described method is applicable to any semiconductor fabrication process where interconnects are formed over planarized surfaces and where it is desirable to form a self aligned transistors. Typically the self aligned transistors include at least two conductive layers, one overlying another, where the first conductive layer is the transistor gate structure and the second one is an interconnect to the active portions of the transistor.

DETAILED DESCRIPTION OF THE INVENTION

Figure 1A:
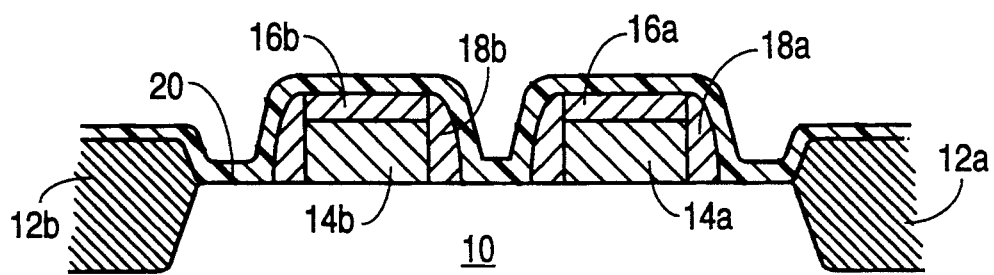
FIGS. 1a to 1m show in cross-section process steps in a first embodiment of the invention.

FIGS. 1a through 1m show in cross-section process steps for the first embodiment. FIG. 1a shows a self-aligned transistor structure for a CMOS integrated circuit. The fabrication steps to form this structure are described in the above-referenced U.S. Pat. No. 5,166,771. Substrate 10 is a doped substrate. Regions 12a and 12b are field oxide regions. Doped polysilicon conductive gate electrodes 14a and 14b are laterally surrounded by sidewall spacers respectively 18a and 18b formed of silicon dioxide and covered on top by a layer of silicon nitride respectively 16a and 16b. As described in the above-referenced patent, also optionally present is an oxide layer (not shown) located between respectively regions 16b and 14b and between regions 16a and 14a.

Not shown in FIG. 1a for simplicity (but understood as being present) are source and drain regions and optionally lightly doped drain regions all formed in the semiconductor substrate 10 by ion implantation (as described in the above-referenced patent) using a self-aligning process. The dimensions and process parameters set forth in the above-referenced patent are not deemed critical to the present invention.

Departing from the process of the above-referenced patent, in FIG. 1a silicon dioxide layer 20 is conventionally deposited by CVD to a thickness of about 1500 Å. This is somewhat thicker than the corresponding silicon dioxide layer described in the above-referenced patent wherein such thickness is about 1200 Å. The additional thickness herein is useful in subsequent steps due to overetching of this layer.

Figure 1B:
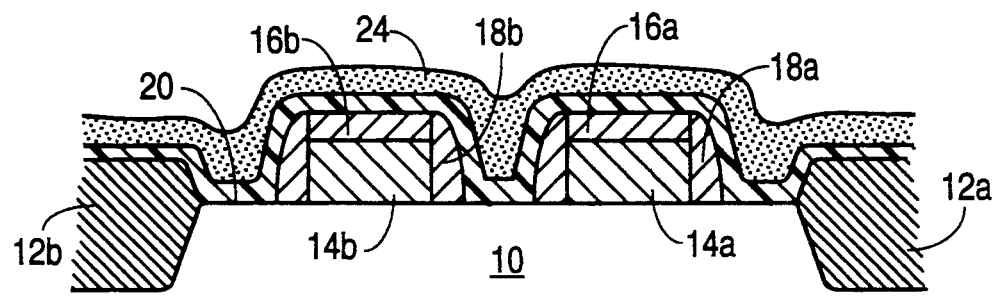

Next, in FIG. 1b a layer of doped BPSG is deposited to a thickness of about 2500 Å. This is the least possible thickness providing adequate reflow. Then in FIG. 1b, BPSG layer 24 is subject to a reflow step which also anneals the source and drain regions. This fellow/annealing step is conducted at 875° C. for twenty minutes.

Figure 1C:
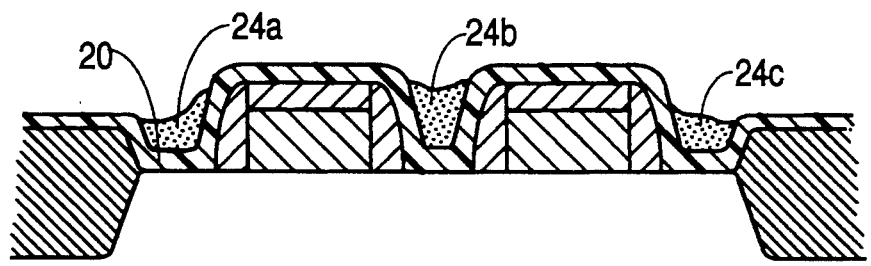

Next, as shown in FIG. 1c the BPSG layer 24 is blanket etched so that only portions 24a, 24b and 24c remain, i.e. the valleys between the gate structures and between the gate structures and field oxide regions are filled by BPSG layer portions 24a, 24b and 24c. This etching is a conventional anisotropic oxide etch. The doping of the BPSG is such that the BPSG layer 24 etches greater than two times faster than does the underlying oxide layer 20, thus preserving oxide layer 20 during this etch step. Thereby, very little of oxide layer 20 is lost during the BPSG layer etching step. BPSG is used here for the filler layer because of its useful reflow properties. Other applicable filler techniques are spun on glass, or CMP processing using a doped material such as BPSG or PSG for selectivity.

Figure 1D:
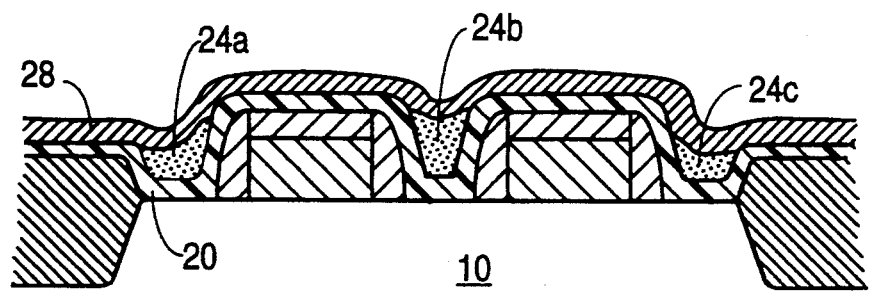

Next as shown in FIG. 1d an undoped thin polysilicon hard mask layer 28 is formed over the entire surface to a thickness of at least 700 Å, so as to avoid any pin holes in layer 28. In place of polysilicon hard mask layer 28 may be titanium or titanium nitride (which strips cleanly and is easily patterned selectively to oxide using an isotropic etch.) Any other sputtered film mask material may also be used.

Figure 1E:
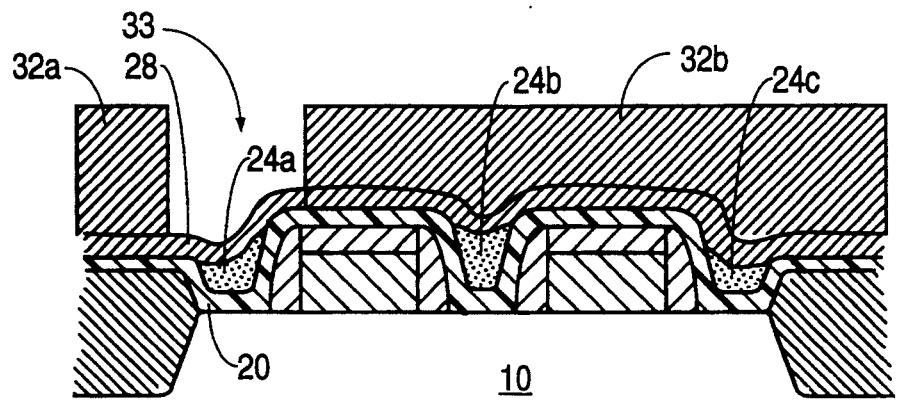

Then as shown in FIG. 1e a photoresist masking layer 32 is applied and conventionally patterned by a buried contact mask (not shown) so as to leave portions 32a and 32b, defining the buried contact mask opening 33. The mask layer 28 is still present in the bottom of opening 33.

Figure 1F:
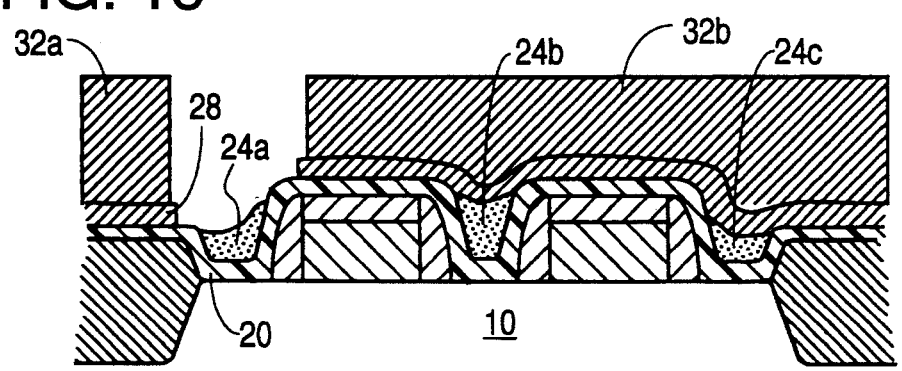
Figure 1G:
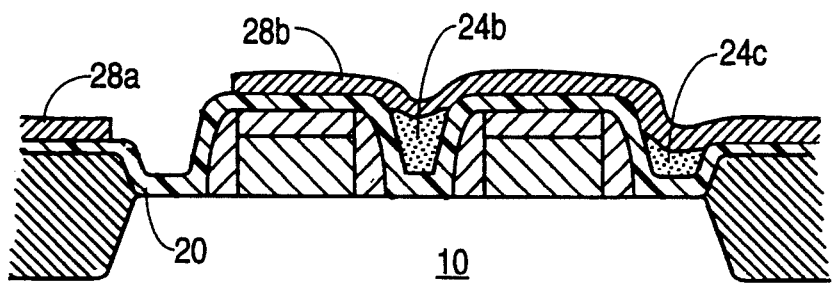

Then in FIG. 1f the portion of mask layer 28 in the opening 33 is removed by a conventional isotropic or anisotropic dry polysilicon etch such as using $SF_6$ or RIE, leaving two portions of the polysilicon layer 28a and 28b. The polysilicon etch is a 50% or less over etching which is adequate because of the relative planarity of the polysilicon layer 28.

Next, in FIG. 1a "wet" i.e. acid 10 parts water to 1 part hydrofluoric acid etch removes the BPSG layer portion 24a from the buried contact opening. The goal is to leave a minimum 1000 Å thickness of oxide layer 20 in the buried contact opening. Thus the wet etch selectively attacks BPSG layer 24a and minimizes etching of underlying portions of undoped oxide layer 20. The present process achieves a relative selectivity of approximately 5 to 7:1 of etching the BPSG versus the undoped oxide. A higher ratio of selectivity is desirable. In the present process approximately 200 Å thickness of oxide layer 20 is lost in this wet etch.

Figure 1H:
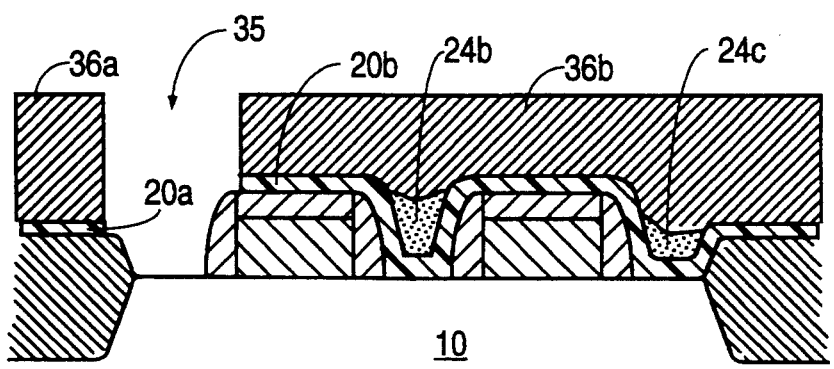

Next as shown in FIG. 1h the remaining portions of the polysilicon mask layer 28a and 28b are conventionally stripped, this layer having served its purpose. For this blanket polysilicon strip, an overetch of 50% or less is adequate because of the relatively planarity of polysilicon layer 28a, 28b. This amount of overetching minimizes the attack on underlying portions of oxide layer 20.

Then as shown on FIG. 1h a second use is made of the buried contact mask of FIG. 1e to pattern a second photoresist layer 36 into portions 36a and 36b, again defining the buried contact opening here designated as 35. Thus the same buried contact mask is used twice in one embodiment. Alternatively, the mask used in this step may be a different mask having a slightly smaller opening. Then in the opening 35 the portions of oxide layer 20 exposed by mask layers 36a, 36b are subject to a dry etch (such as reactive ion etching) as is well known in the art. This is preferably a selective-type dry etch, because any remaining portions of BPSG layer 24a which may be present in the opening 35 would etch faster than the underlying oxide layer 20 and it is important not to over etch too much of the underlying oxide layer 20 so as not to erode the oxide spacer on the side surfaces and nitride on the top surface protecting the gate polysilicon from shorting to the local interconnect. In this step also the source/drain oxide layer (not shown) which was conventionally formed to a thickness of about 100 Å on the surface of substrate 10 is removed along with overlying oxide layer 20. (This oxide feature is not shown in the drawings for simplicity.)

Figure 1I:
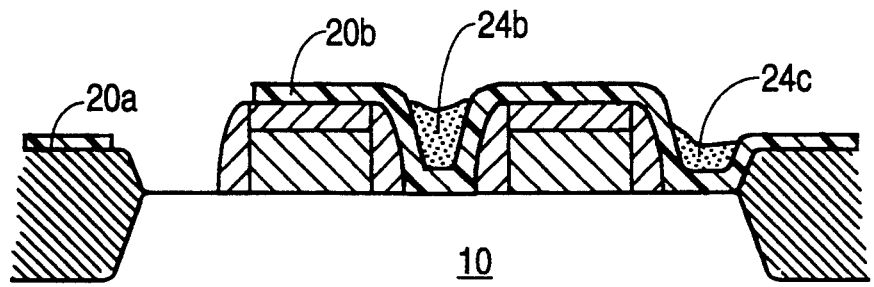

In FIG. 1i the photoresist masking layer 36a, 36b is conventionally stripped.

Figure 1J:
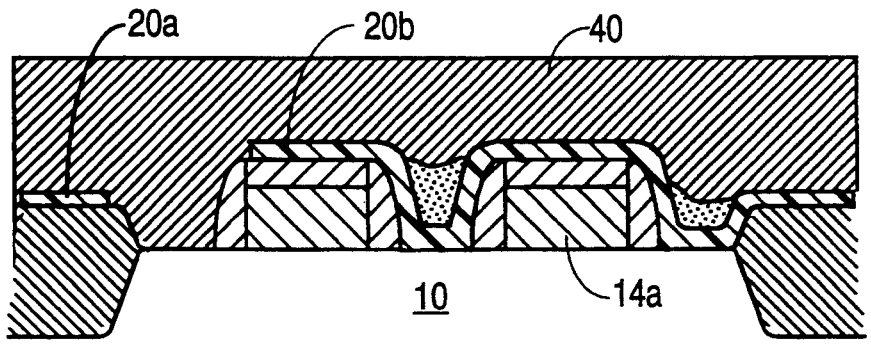
Figure 1K:
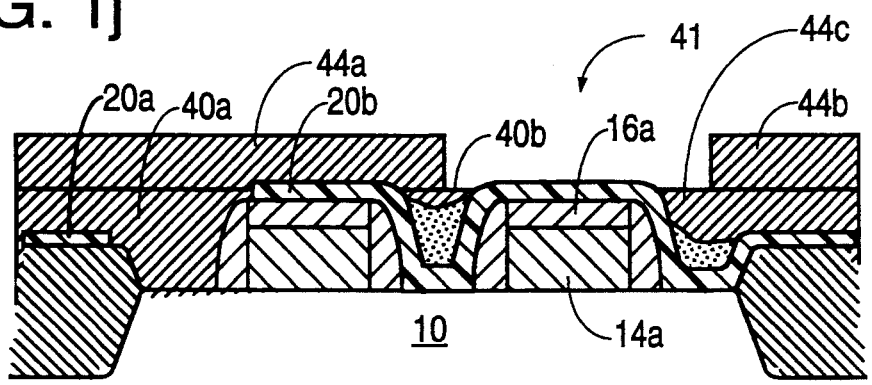
Figure 1L:
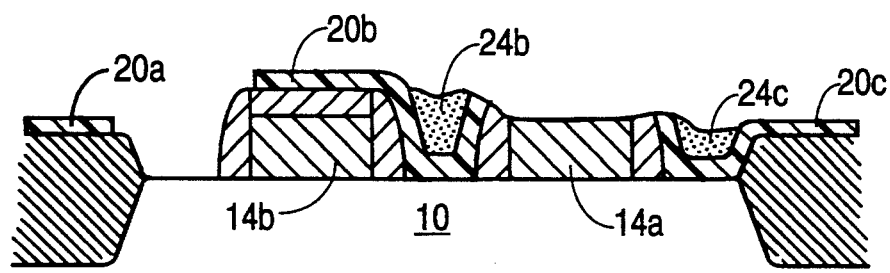

Subsequent steps in FIG. 1j through 1l show the polysilicon isolation process for forming the gate contacts described in the above-referenced patent. They are described here in summary. In FIG. 1j a first photoresist layer 40 is formed, baked, and then etched down so as to expose the upper portions of the gate structures, i.e. the high portions of layer 20b, by blanket etching. Then a second photoresist layer 44 is formed as shown in FIG. 1k which is conventionally patterned to form an opening 41 over the gate structure including gate electrode 14a. Opening 41 is then subject to etching to expose gate electrode 14a as shown in FIG. 1l, by removing portions of oxide layer 20b and underlying silicon nitride insulation 16a. Also in FIG. 1l subsequently both photoresist layers 40 and 44 are stripped.

Figure 1M:
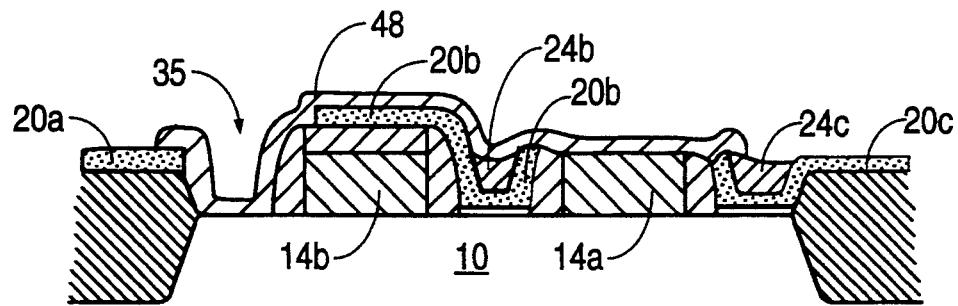

Then in FIG. 1m a doped polysilicon (or alternatively metal) layer 48 is conventionally deposited and patterned by a mask to form local interconnect conductor 48 which contacts substrate 10 in the buried contact mask opening 35 and also contacts gate electrode 14a. The etching step in defining local interconnect 48 involves typically a 50% overetch (in contrast to the prior art 150% overetch for a non-planarized surface). The doping of polysilicon 48 is accomplished by implanting at a concentration of 5E 15/$cm^2$ and using a positive implanted ion such as arsenic. Advantageously since the surface over which conductor 48 is formed is relatively planar, a relatively minimal overetch is needed to define conductor 48, allowing conductor 48 to be relatively thick, which advantageously allows minimizes use of chip real estate. That is to say, since the overetching of layer 48 is minimized, layer 48 will have a substantial final width and hence may be drawn to a tighter line/space pitch and still have relatively low electrical resistance.

Subsequent steps are not shown here but are described in the above-referenced patent and typically include sputtering a titanium layer over the surface and forming a self-aligned silicide layer so that only the local interconnect polysilicon layer 48 is silicided. Any titanium present between the various local interconnects is excess titanium which is subsequently stripped off. This provides a titanium silicide conductor 48 linking the buried contact to the gate electrode 14a. Then conventionally additional insulative and conductive layers are formed thereover.

Figure 2F:
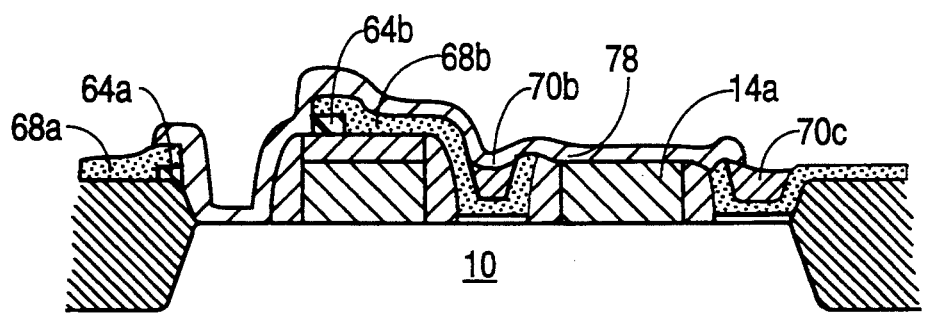
FIGS. 2a through 2f show in cross-section process steps in a second embodiment of the invention.
Figure 2A:
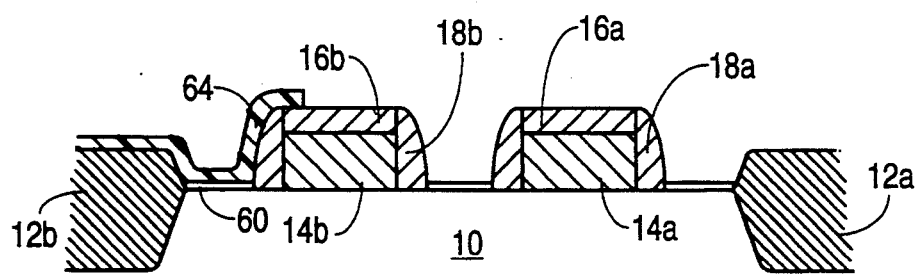

FIGS. 2a through 2f show process steps for the second embodiment. FIG. 2a shows structures similar to those of FIG. 1a using identical reference numbers. In addition, FIG. 2a shows the source/drain oxide layer 60 (which is also present in FIG. 1a but not shown) formed on the surface of substrate 10 to a thickness of about 100 Å. It is to be understood that the active transistor implanted regions in substrate 10 are not shown in FIG. 2a.

Departing from the process of FIG. 1a, in FIG. 2a a thin undoped polysilicon layer 64 is conventionally deposited to a thickness of 500 to 700 Å, i.e. thick enough to serve later as an etch stop. Again, a sputtered film mask material may be used in place of polysilicon. Polysilicon layer 64 is conventionally patterned and etched so that only "landing pad" 64 remains located in a buried contact opening and extending over the sidewall 18b of the adjacent gate structure and also over the side of adjacent field oxide region 12b. This etch step is selective to oxide so as not to attack the underlying source/drain oxide layer. It is to be understood that in a top view (not shown) polysilicon landing pad 64 is approximately round. Polysilicon layer 64 is patterned by an oversized buried contact mask, so that as shown polysilicon landing pad 64 overlaps the adjacent structures 12b and 18b.

Figure 2B:
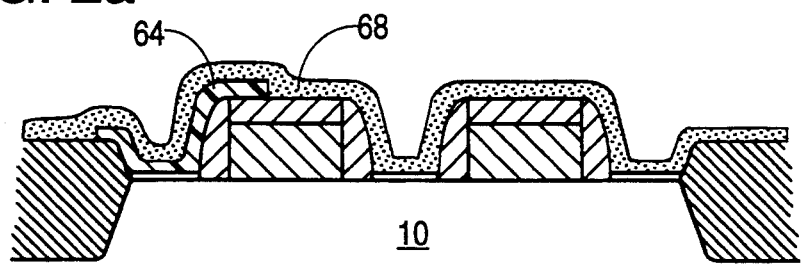
Figure 2C:
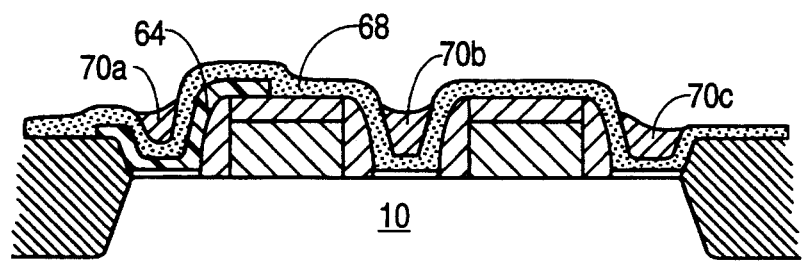

Next as shown in FIG. 2b, oxide layer 68 is deposited by CVD to a thickness of approximately 1200 Å (but in one embodiment as little as 800 Å thick). Then, also shown in FIG. 2c, a BPSG layer 70 approximately 2500 Å thick is formed over the entire surface and then after reflow is blanket etched down so as to leave only portions 70a, 70b, 70c planarizing the surface. BPSG layer 70 is as thin as possible to allow reflow prior to the subsequent etching step. The object of the BPSG etch step is to remove all of the BPSG layer 70 except that present in the low regions, so that the higher portions of underlying oxide layer 68 are exposed as shown in FIG. 2c. The reflow is (as described above) at 875° for 20 minutes and this step also simultaneously anneals the implanted regions.

Figure 2D:
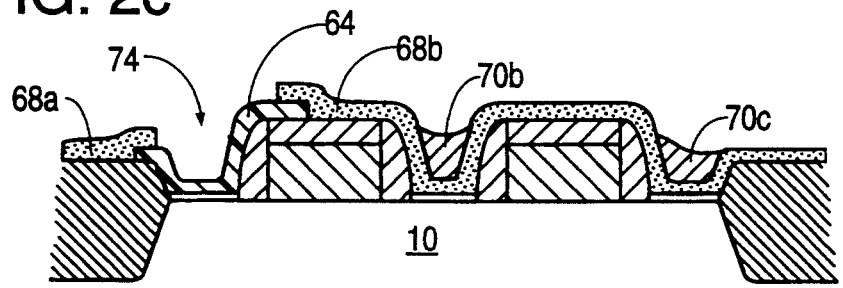

Then in FIG. 2d a second buried contact mask step is performed this time using a slightly undersized buried contact mask i.e. the opening 74 defined by this mask (not shown) is smaller in diameter than the opening defined by the mask used to pattern layer 64 in FIG. 2a. In subsequent etching steps (as shown in FIG. 2d) the BPSG portion 70a is removed, as are the underlying portions of oxide layer 68. BPSG layer 70a and the underlying portions of oxide layer 68 are removed by a conventional oxide etch which is selective so as not to etch polysilicon.

This leaves the structure shown in FIG. 2d with the edge portions of polysilicon landing pad 64 extending under remaining portions of overlying oxide layer 68a, 68b. Comparison of FIG. 2a to FIG. 2d shows the difference in the diameters of the openings defined by the first buried contact mask of FIG. 2a and the second buried contact mask of FIG. 2d. Thus two separate masks are required.

Figure 2E:
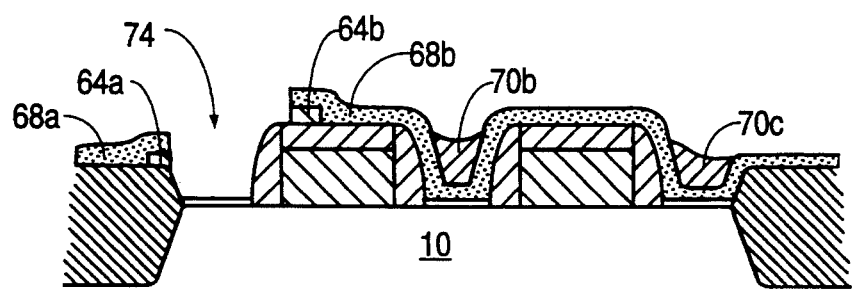

Then as shown in FIG. 2e the central portion of landing pad 64 is removed by a conventional plasma polysilicon etch (RIE) etch selective to oxide.

As shown in FIG. 2e, source/drain oxide layer 60 remains protecting the underlying substrate 10 in opening 74. Then this thin oxide layer 60 in opening 74 is removed by a short duration conventional oxide etch. Thus the presence of oxide layer 60 prevents the step of removing landing pad 64 from also removing underlying portions of substrate 10. The second buried contact mask layer (not shown) is then removed.

As shown in FIG. 2e, remaining portions 64a, 64b of landing pad 64 remain embedded under oxide layer portions 68a, 68b. In a top view, portions 64a and 64b are connected and form a "donut" like structure which is benign in its effect on the transistor electrical operation since it is grounded by the local interconnect 78 (see FIG. 2f). This donut 64a, 64b is thus an artifact of the processing steps.

The subsequent steps to form the polysilicon isolation, i.e. the contact to gate electrode 14a, are identical to those described above in conjunction with FIGS. 1j through 1l, and therefore not shown.

The next step is shown in FIG. 2f wherein local interconnect 78 which is again doped polysilicon is formed over the entire structure, contacting substrate 10 in the buried contact opening and also contacting gate electrode 14a. Interconnect 78 as described above is conventionally patterned to define the local interconnect. The remaining process steps are again as described above and in more detail in the above-referenced patent.

It has been found that the process of FIG. 2 is advantageously more suitable to conventional semiconductor manufacturing processing than is the process of FIG. 1, since polysilicon landing pad 64 is a definite etch stop which is a substantially different material than the underlying source/drain oxide 60. This is in contrast to the process steps of FIG. 1 which rely on the selectivity of etching between BPSG and the underlying oxide layer, which is not so distinct in its effect; however a more selective BPSG to oxide process will enhance this option. For instance, an anhydrous HF dry etch is known to provide a 2000:1 selectivity.

In a variant of the process of FIGS. 2b, 2c, and 2d, it is not necessary to perform the blanket BPSG layer etch of FIG. 2c. Instead after formation of BPSG layer 70 over the entire surface, the mask defining the buried contact is applied over this BPSG layer 70 and in a single step one etches down through BPSG layer 70 and into the underlying oxide layer 68. Thus it is possible to etch right through the blanket layer BPSG 70. However, such a step increases the chances of accidentally penetrating the polysilicon landing pad 64 in subsequent steps and such a step creates a longer vertical drop in the contact, demanding more from the local conductor. Hence better control is provided by the process steps shown in FIGS. 2a, 2b, 2c and 2d.

It will be appreciated by one of ordinary skill in the art that alternate materials and techniques are usable. As described above, various other planarization methods are compatible with the invention. The planarizing material could also be BPTEOS (a variation of BPSG). Also the hard masks which in both of the above described embodiments are polycrystalline silicon could be other materials such as silicon nitride or photoresist (for the process of FIG. 1 only). The main problem is to avoid material that would lift in subsequent etching steps. Polysilicon advantageously is not subject to lifting during wet etching.

Also the local interconnect conductors need not be polycrystalline silicon, but could be aluminum, titanium, titanium nitride, tungsten, or silicides thereof, or any refractory metal, alloy, or silicide.

The top side geometry of the structures in accordance with the invention are described in the above-referenced patent. It is also to be understood that the present invention is applicable to processes other than those described in the above referenced patent, for instance, to formation of any of the various types of MOS transistors.

I claim:

1. A method of forming an integrated circuit comprising:
    providing a semiconductory substrate having a principal surface;
    forming on the principal surface a plurality of spaced apart gate structures;
    implanting a dopant in the substrate after the step of forming the gate structures, thereby forming at least one doped region int he substrate;
    forming a masking layer on the principal surface overlying the at least one doped region;
    patterning the masking layer;
    then planarizing the principal surface by forming a filler layer over the principal surface and over the gate structures and patterned mask layer;

defining a contact opening to the at least one doped region by removing a portion of the filler layer overlying the doped region, the filler layer otherwise remaining overlying a portion of the principal surface between two of the gate structures; and then etching to remove the underlying patterned mask layer.

2. The method of claim 1, wherein the step of defining a contact opening includes removing a central portion of the patterned mask layer, but not removing a peripheral portion thereof.

3. The method of claim 1, wherein the patterned masking layer overlies at least a portion of an adjacent gate structure.

4. The method of claim 1, further comprising the step of forming an insulating layer over the gate structures and over the principal surface prior to the step of planarizing, wherein the filler layer is a glass material.

5. The method of claim 4, wherein the glass material is at least 800 Å thick when formed.

6. The method of claim 1, further comprising the step of forming an insulating layer over the gate structure and over the principal surface prior to the step of planarizing, wherein the filler layer is a glass material.

7. The method of claim 6, wherein the step of defining includes the steps of:

etching to remove the filler layer; and a then etching to remove the underlying insulating layer.

8. A method of forming an integrated circuit, comprising the steps of:

providing a semiconductor substrate having a principal surface;

forming on the principal surface a plurality of spaced apart gate structures each including a conductive electrode surrounded on its lateral and top surfaces by a first insulating layer;

implanting a dopant in portions of the substrate adjoining the gate structure;

forming a second insulating layer over the principal surface;

forming a filler layer over the second insulating layer;

removing at least part of the filler layer;

forming a masking layer over the filler layer;

patterning the masking layer, thereby exposing a portion of the filler layer;

removing at least part of the exposed portion of the filler layer and the underlying second insulating layer, thereby exposing a portion of the principal surface; and forming a conductive contact to the exposed portion of the principal surface.

9. The method of claim 8, wherein the mask layer comprises polycrystalline silicon.

10. The method of claim 8, wherein the mask layer comprises titanium.

11. The method of claim 8, wherein the filler layer is a doped glass.

12. The method of claim 11, wherein the doped glass is boro-phosphosilicate glass.

13. The method of claim 8, wherein the filler layer is at least 800 Å thick when formed.

14. The method of claim 8, wherein the step of forming a filler layer comprises:

forming a layer of glass at least 800 Å thick; and reflowing the glass layer.

15. The method of claim 8, wherein the step of removing at least part of the filler layer comprises removing an upper portion of the filler layer, thereby exposing those portions of the underlying second insulating layer overlying the gate structures.

16. The method of claim 8, wherein the exposed portion of the principal surfaces overlies one of the portions of the substrate having the implanted dopant.

17. The method of claim 8, further comprising the step of forming an electrical contact to the conductive electrode of at least one of the gate structures.

18. The method of claim 8, wherein the step of removing at least part of the filler layer comprises:

etching the at least part of the filler layer; and then etching the underlying second insulating layer.

19. The method of claim 18, wherein the first etching step uses an acid and the second etching step is a dry etching.

20. A method of forming an integrated circuit, comprising the steps of:

providing a semiconductor substrate having a principal surface;

forming on the principal surface a plurality of spaced apart gate structures each including a conductive electrode surrounded on its lateral and top surfaces by a first insulating layer;

implanting a dopant in portions of the substrate extending to the principal surface at locations adjoining the gate structures;

forming a masking layer over the principal surface and the gate structures;

patterning the masking layer to remove portions thereof, the remaining portions overlying the principal surface at the locations adjoining the gate structures;

forming a second insulating layer extending over the gate structures and the masking layer and the principal surface;

forming a filler layer over the second insulating layer;

removing at least part of the filler layer and at least part of the underlying second insulating layer, thereby exposing at least part of the remaining portion of the masking layer;

removing the exposed part of the masking layer; and forming a conductive contact to the portion of the substrate underlying the location of the removed part of the masking layer.

21. The method of claim 1, wherein the step of defining a contact opening results in at least one of the gate structures having a sidewall of a single layer of insulating material.

22. A method of forming an integrated circuit comprising:

providing a semiconductor substrate having a principal surface;

forming on the principal surface a plurality of spaced apart gate structures;

implanting a dopant int he substrate after the step of forming the gate structures, thereby forming at least one doped region int he substrate;

planarizing the principal surface by forming a filler layer over the principal surface and over the gate structure;

uniformly etching away a top portion of the filler layer, exposing an upper portion of the gate structure;

then, forming a mask layer over the gate structures and over remaining portion of the filler layer;

defining a opening int he mask layer adjacent one of the gate structure; and then, etching away the filler layer and down to the principal surface of the substrate through the opening, thereby defining a contact opening to the principal surface.

* * * * *

UNITED STATES PATENT AND TRADEMARK OFFICE
CERTIFICATE OF CORRECTION

PATENT NO.    :   5,340,774
DATED         :   08/23/94
INVENTOR(S)   :   Ting-Pwu Yen It is certified that error appears in the above-identified patent and that said Letters Patent is hereby corrected as shown below:

```
    Column 1, line 12, delete "-" and insert --,--.
    Column 6, lines 3, 14 and 16, delete "FIG. 11" and
insert --FIG. 1l--.
    Column 8, line 56, delete "semiconductory" and insert
--semiconductor--.
    Column 8, line 62 delete "int he" and insert --in
the--.
    Column 10, lines 52, 54 and 62, delete "int he" and
insert --in the--.
```

Signed and Sealed this

Third Day of October, 1995

Attest:

BRUCE LEHMAN

*Attesting Officer*        *Commissioner of Patents and Trademarks*

UNITED STATES PATENT AND TRADEMARK OFFICE
CERTIFICATE OF CORRECTION

PATENT NO.   : 5,340,774
DATED        : Aug. 23, 1994
INVENTOR(S)  : Ting-Pwu Yen It is certified that error appears in the above-identified patent and that said Letters Patent is hereby corrected as shown below:

In the drawings, original Fig. 1m, there is an unnecessary and unlabelled space immediately underneath regions 20b and 20c.

Please replace original FIG. 1m with FIG. 1m as follows:

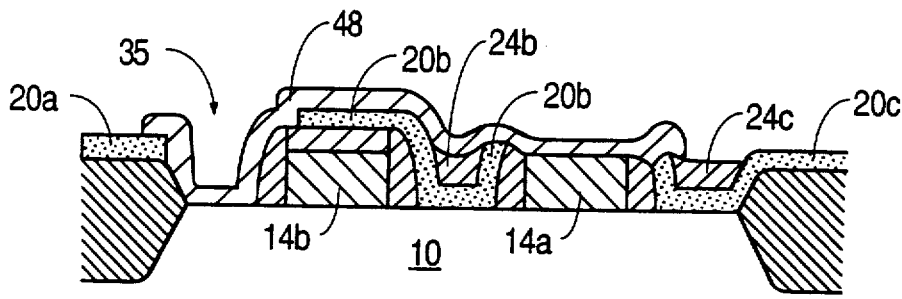

FIG. 1m